US012610537B2

(12) United States Patent
Liao et al.

(10) Patent No.: US 12,610,537 B2
(45) Date of Patent: Apr. 21, 2026

(54) SEMICONDUCTOR STRUCTURE WITH BUFFER LAYER BETWEEN CONDUCTIVE CONTACT AND WORD LINE AND METHOD FOR FORMING THE SAME, AND MEMORY

(71) Applicant: CHANGXIN MEMORY TECHNOLOGIES, INC., Hefei City (CN)

(72) Inventors: Yu-Cheng Liao, Hefei City (CN); Muyu Chen, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 503 days.

(21) Appl. No.: 18/161,985

(22) Filed: Jan. 31, 2023

(65) Prior Publication Data

US 2024/0064970 A1      Feb. 22, 2024

Related U.S. Application Data

(63) Continuation of application No. PCT/CN2022/115545, filed on Aug. 29, 2022.

(30) Foreign Application Priority Data

Aug. 19, 2022 (CN) .......................... 202210999354.6

(51) Int. Cl.
*H10B 12/00* (2023.01)
(52) U.S. Cl.
CPC ........... *H10B 12/488* (2023.02); *H10B 12/03* (2023.02); *H10B 12/485* (2023.02)

(58) Field of Classification Search
CPC ............... H01L 23/562; H01L 23/3128; H01L 23/49811; H01L 23/5383; H01L 23/5385;
(Continued)

(56) References Cited

U.S. PATENT DOCUMENTS 10,056,528 B1      8/2018 Qian
2006/0001161 A1*  1/2006 Graettinger ........ H10B 12/0335
                                                             257/E21.507
(Continued)

FOREIGN PATENT DOCUMENTS

CN      108110005 A      6/2018
CN      209312720 U      8/2019
(Continued)

OTHER PUBLICATIONS

International Search Report in the international application No. PCT/CN2022/115545, mailed on May 9, 2023.

*Primary Examiner* — Duy T Nguyen
(74) *Attorney, Agent, or Firm* — Syncoda LLC; Feng Ma

(57) ABSTRACT

The disclosure relates to the field of semiconductor technologies, and to a semiconductor structure and a method for forming the same, and a memory. The semiconductor structure of the disclosure includes a substrate, a word line structure, a conductive contact structure and a buffer layer. The substrate includes an active area; the active area includes a channel area, and a source area and a drain area that are respectively distributed on two sides of the channel area; the channel area has a word line groove; the word line structure is located in the word line groove; the conductive contact structure is connected to a top of the drain area; and the buffer layer is located between the conductive contact structure and the word line structure.

9 Claims, 7 Drawing Sheets

(58) Field of Classification Search
CPC ..... H01L 23/5386; H01L 24/16; H01L 24/32; H01L 24/73; H01L 2224/16227; H01L 2224/32225; H01L 2224/73204; H01L 23/13; H01L 2224/81; H01L 24/83; H01L 25/105; H01L 23/49816; H01L 24/97; H01L 24/15; H01L 25/0657; H01L 25/18; H01L 2224/97; H10B 80/00; H05K 1/181
USPC ........................................................ 257/295
See application file for complete search history.

(56) References Cited

U.S. PATENT DOCUMENTS

| | | | | |
|---|---|---|---|---|
| 2008/0157155 A1* | 7/2008 | Wang | ..................... | H10B 53/00 257/295 |
| 2009/0176361 A1* | 7/2009 | Park | ..................... | H10B 12/485 257/E21.477 |
| 2011/0186798 A1* | 8/2011 | Kwon | ................ | H10N 70/8828 257/E45.002 |
| 2012/0181625 A1 | 7/2012 | Kwok | | |
| 2015/0340453 A1* | 11/2015 | Cho | ..................... | H10B 12/482 257/330 |
| 2021/0327882 A1* | 10/2021 | Liao | ..................... | H10B 12/482 |
| 2022/0037489 A1 | 2/2022 | Kim | | |

FOREIGN PATENT DOCUMENTS

| | | |
|---|---|---|
| CN | 111063722 A | 4/2020 |
| CN | 114068690 A | 2/2022 |

* cited by examiner

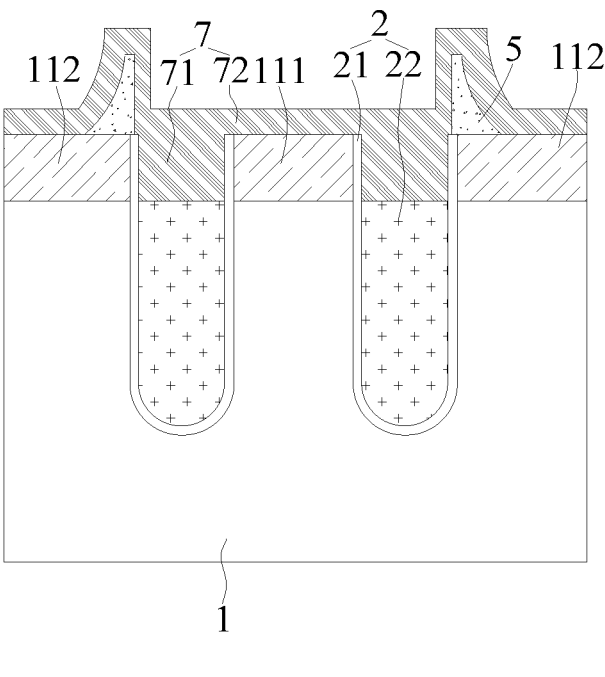

FIG. 7

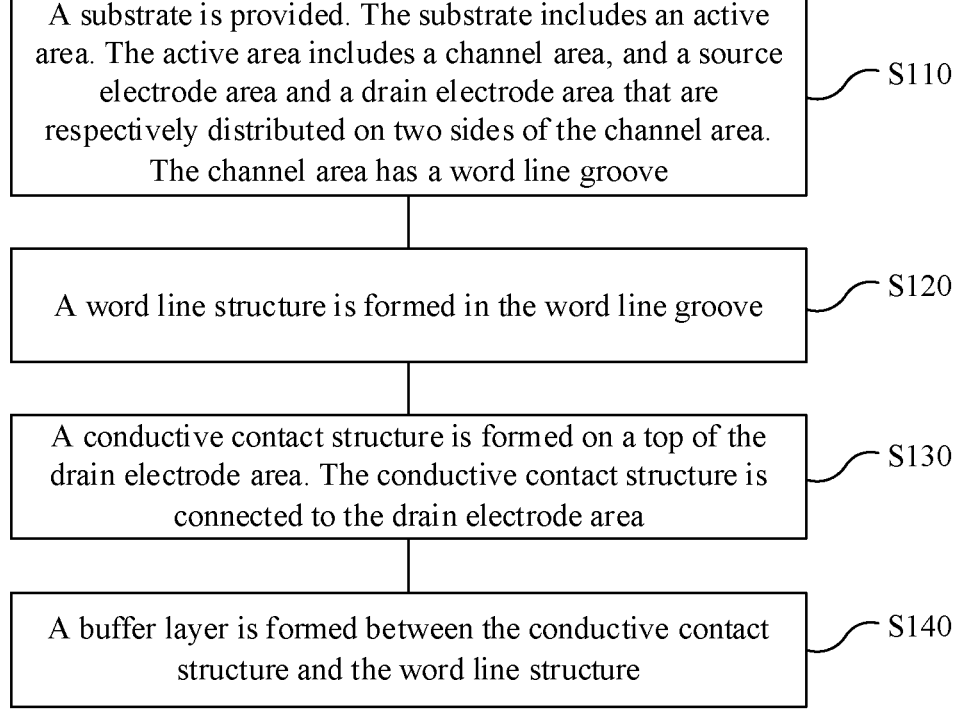

| | |
|---|---|
| A substrate is provided. The substrate includes an active area. The active area includes a channel area, and a source electrode area and a drain electrode area that are respectively distributed on two sides of the channel area. The channel area has a word line groove | S110 |
| A word line structure is formed in the word line groove | S120 |
| A conductive contact structure is formed on a top of the drain electrode area. The conductive contact structure is connected to the drain electrode area | S130 |
| A buffer layer is formed between the conductive contact structure and the word line structure | S140 |

FIG. 8

SEMICONDUCTOR STRUCTURE WITH BUFFER LAYER BETWEEN CONDUCTIVE CONTACT AND WORD LINE AND METHOD FOR FORMING THE SAME, AND MEMORY

CROSS-REFERENCE TO RELATED APPLICATIONS

The present application is a continuation of International Application No. PCT/CN2022/115545 filed on Aug. 29, 2022, which claims priority to Chinese Patent Application No. 202210999354.6, filed on Aug. 19, 2022, the disclosures of which are hereby incorporated by reference in their entirety.

BACKGROUND

A Dynamic Random Access Memory (DRAM) is widely applied to mobile devices such as mobile phones and tablet computers due to its advantages of small size, high degree of integration and fast transmission speed.

With the advancing of a semiconductor technology, the miniaturization of a DRAM related space size greatly facilitates the saving of costs and the creation of benefits. The size of a DRAM is positively correlated to the reliability of the DRAM, so that how to ensure that the performance of the DRAM is not affected or even better while the size of the DRAM is miniaturized becomes a research hotspot. However, as the size miniaturizes, the leak current between internal structures of the DRAM gets larger and larger, resulting in reduction of device reliability and increasing of stand-by power consumption.

It is to be noted that, information disclosed in the above Background section is merely for enhancement of understanding of the background of the disclosure, and may include information that does not constitute the prior art that is already known to those of ordinary skill in the art.

SUMMARY

The disclosure relates to the field of semiconductor technologies, and specifically, to a semiconductor structure and a method for forming the same, and a memory.

An aspect of the disclosure provides a semiconductor structure, including a substrate, a word line structure, a conductive contact structure and a buffer layer.

The substrate includes an active area. The active area includes a channel area, and a source area and a drain area that are respectively distributed on two sides of the channel area. The channel area has a word line groove.

The word line structure is located in the word line groove.

The conductive contact structure is connected to a top of the drain area.

The buffer layer is located between the conductive contact structure and the word line structure.

An aspect of the disclosure provides a method for forming a semiconductor structure. The method includes the following operations.

A substrate is provided. The substrate includes an active area. The active area includes a channel area, and a source area and a drain area that are respectively distributed on two sides of the channel area. The channel area has a word line groove.

A word line structure is formed in the word line groove.

A conductive contact structure is formed on a top of the drain area. The conductive contact structure is connected to the drain area.

A buffer layer is formed between the conductive contact structure and the word line structure.

An aspect of the disclosure provides a memory, including the semiconductor structure described in any one of the above.

It should be understood that, the above general description and the following detailed description are merely exemplary and explanatory, and cannot limit the disclosure.

BRIEF DESCRIPTION OF THE DRAWINGS

Drawings are incorporated into the specification and constitute a part of the specification. The drawings illustrate embodiments in accordance with the disclosure and serve to understand the principles of the disclosure together with the specification. It is apparent that the drawings in the following descriptions are merely some embodiments of the disclosure. Other drawings can be obtained by those skilled in the art according to these drawings without any creative work.

FIG. 7 is a schematic diagram of a passivation layer according to an embodiment of the disclosure.

FIG. 8 is a flowchart of a method for forming a semiconductor structure according to an embodiment of the disclosure.

DETAILED DESCRIPTION

Figure 1:
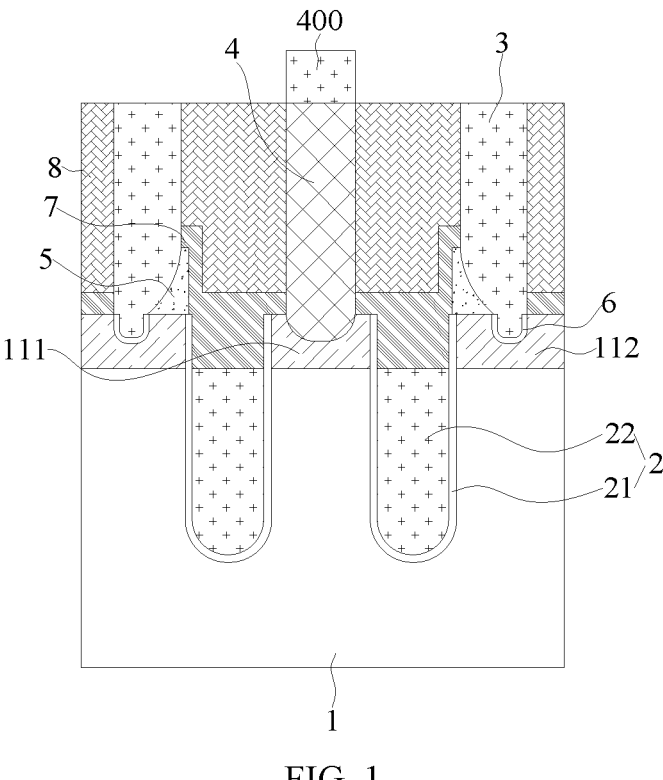
FIG. 1 is a schematic diagram of a semiconductor structure according to an embodiment of the disclosure.

Exemplary embodiments are described more comprehensively with reference to the drawings. However, exemplary embodiments can be implemented in various forms and should not be construed as limited to the embodiments set forth herein. In contrast, these embodiments are provided for more thorough and complete understanding of the disclosure, and to fully convey the concept of the exemplary embodiments to a person skilled in the art. The same reference numerals in the drawings denote same or similar structures, and thus detailed descriptions will be omitted. In addition, the drawings are merely schematic illustrations of the disclosure and are not necessarily drawn to scale.

Although relative terms such as "on" and "under" are used in this specification to describe a relative relationship of one component illustrated in drawings to another component, these terms are used in this specification only for convenience, for example, according to a direction of the example described in the drawings. It may be understood that, if the apparatus illustrated in the drawings is turned upside down, the "on" component described will become the "under" component. When a certain structure is "on" other structures, it may mean that the certain structure is integrally formed on other structures, or that the certain structure is "directly" disposed on other structures, or that the certain structure is "indirectly" disposed on other structures via another structure.

The terms "a", "an", "the", "said" and "at least one" are used to indicate the presence of one or more elements/components/and the like. The terms "including" and "having" are used to indicate an open-ended inclusive meaning and mean that additional elements/components/and the like may be present in addition to the listed elements/components/and the like. The terms "first", "second" and the like are merely used as marks and are not intended to limit the number of objects.

An embodiment of the disclosure provides a semiconductor structure. FIG. 1 is a schematic diagram of a semiconductor structure according to an embodiment of the disclosure. Referring to FIG. 1, the semiconductor structure may include a substrate 1, a word line structure 2, a conductive contact structure 3 and a buffer layer 5.

The substrate 1 may include an active area 11. The active area 11 includes a channel area, and a source area 111 and a drain area 112 that are respectively distributed on two sides of the channel area. The channel area has a word line groove.

The word line structure 2 is located in the word line groove.

The conductive contact structure 3 is connected to a top of the drain area 112.

The buffer layer 5 is located between the conductive contact structure 3 and the word line structure 2.

In the semiconductor structure of the disclosure, the source area 111, the drain area 112 and partial word line structure located at the channel area form an embedded transistor, so that the integration level of a device can be enhanced. In addition, the conductive contact structure 3 connected to the drain area 112 is connected to a capacitor (not shown in the figure). Since the buffer layer 5 is located between the conductive contact structure 3 and the word line structure 2, a physical dimension between the word line structure 2 and the conductive contact structure 3 is increased, so that an electric field between a drain and a gate can be reduced, so as to reduce Gate-Induced Drain Leakage (GIDL) current. In addition, due to the increasing of the physical dimension, in addition to effectively reducing stand-by power consumption and improving the reliability of the device, large interface leak current between the substrate and source-drain doping areas (p-n) caused by excessively deep depth can be effectively avoided during etching.

Details of portions of the semiconductor structure according to the embodiments of the disclosure are described in detail below.

As shown in FIG. 1, the substrate 1 may be of a flat-plate structure, which may be a rectangle, a circle, an ellipse, a polygon, or an irregular shape. A material of the substrate may be a semiconductor material, for example, may be silicon, but is not limited to the silicon or other semiconductor materials, and the shape and material of the substrate 1 are not specifically limited thereto.

In an embodiment, the substrate 1 may be a silicon substrate, and a plurality of shallow trench isolation structures (not shown in the figure) are formed in the substrate. The shallow trench isolation structures may be formed by first forming grooves in the substrate 1 and then filling insulation material layers in the grooves. A material of the shallow trench isolation structure may include silicon nitride or silicon oxide, which is not specially limited herein. A shape of a cross section of the shallow trench isolation structure may be designed according to actual requirements. The plurality of shallow trench isolation structures may be distributed side by side, and can isolate a plurality of active areas 11 on the substrate 1. Each active area 11 may include a first doping area and a second doping area that are arranged in a spaced manner.

The substrate 1 may be p-type substrate. The first doping area and the second doping area may be doped to respectively form a source area 111 and a drain area 112. For example, n-type doping may be performed on the first doping area and the second doping area, so as to form an n-type doping area. The n-type doping area may be form a p-n junction with the p-type substrate.

It is to be noted that, there may be a channel area (not shown in the figure) between the source area 111 and the drain area 112 (that is, the active area 11 may include the channel area, and the source area 111 and the drain area 112 that are respectively distributed on two sides of the channel area). A current may flow in the channel area. The current in the channel area may be controlled by a voltage of the word line structure 2 that is subsequently formed in the channel area, so as to achieve a gate-control function.

In an exemplary embodiment of the disclosure, a word line groove may be formed in the channel area and may be configured to form the word line structure 2. For example, the substrate 1 may be etched to form the word line groove. The word line groove is penetrable on two ends and may be in a strip shape. The word line groove may penetrate a plurality of active areas 11, and a portion of the word line groove that penetrates the active areas 11 and is in the active areas 11 may be located in the channel areas of the active areas 11.

For example, a photoresist layer may be formed on a surface of the substrate 1 by means of spin coating or other manners. A material of the photoresist layer may be a positive photoresist or a negative photoresist, which is not particularly limited herein.

The photoresist layer may be exposed by using a mask. A pattern of the mask may match a pattern required for the word line groove. Then, the exposed photoresist layer may be developed to form a development area. Each development area may expose the surface of the substrate 1. A pattern of the development area may be the same as the pattern required for the word line groove. A size of the development area may match a size required for the word line groove.

By means of a plasma etching process, the substrate 1 may be etched in the development area, so as to form the word line groove in the substrate 1. After the etching process is completed, the photoresist layer may be cleaned by means of a cleaning solution or removed by means of processes such as ashing, so that the substrate 1 having the word line groove is exposed.

The word line structure 2 may be located in the word line groove. In some embodiments of the disclosure, a top of the word line structure 2 may be lower than a top surface of the word line groove, so as to leave space for a protective layer 71 that is subsequently formed. That is to say, the word line structure 2 may be formed in the word line groove.

Figure 2:
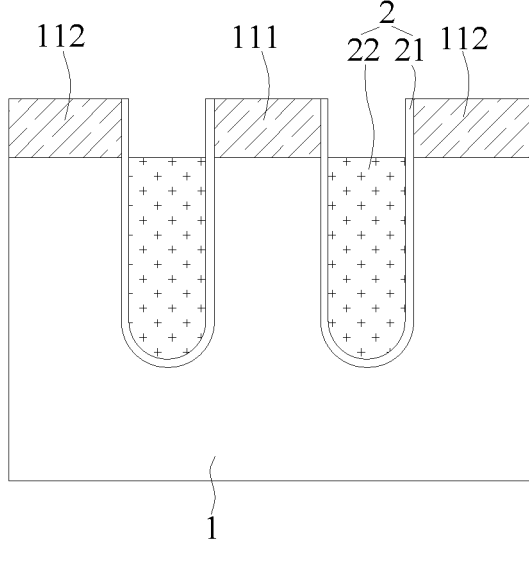
FIG. 2 is a schematic diagram of a word line structure according to an embodiment of the disclosure.

In an exemplary embodiment of the disclosure, FIG. 2 is a schematic diagram of a word line structure according to an embodiment of the disclosure. As shown in FIG. 2, the word line structure 2 may include an inter-gate dielectric layer 21 and a conductive layer 22.

The fitly attached inter-gate dielectric layers 21 may be formed on a sidewall and bottom of each word line groove. A material of the inter-gate dielectric layer 21 may include silicon oxide and the like, or may be a combination of the foregoing materials. A thickness of the inter-gate dielectric layer may range from 1 nm to 9 nm, for example, may be 1 nm, 2 nm, 4 nm, 6 nm, 8 nm, or 9 nm. Definitely, there may be other thicknesses, which are not enumerated herein.

For example, the fitly attached inter-gate dielectric layers 21 may be formed on the sidewall and bottom of each word line groove by means of chemical vapor deposition, physical vapor deposition, atomic layer deposition, thermal evaporation or thermal oxidation. Definitely, the inter-gate dielectric layer 21 may be formed in other manners, which is not specially limited herein. For ease of process, in a process of forming the inter-gate dielectric layer 21, the inter-gate dielectric layer 21 may completely cover the top surface of the substrate 1. Then, the inter-gate dielectric layer 21 on the top surface of the substrate 1 may be removed, and only the inter-gate dielectric layers 21 on the sidewall and bottom of each word line groove are retained.

In some embodiments of the disclosure, a surface of the inter-gate dielectric layer 21 may be processed by means of a thermal oxidation process, to improve the compactness of a film layer of the inter-gate dielectric layer 21, so as to reduce leak current and enhance gate-control capabilities.

In an exemplary embodiment of the disclosure, continuously referring to FIG. 2, the conductive layer 22 may fill the word line groove having the inter-gate dielectric layer 21. A surface of the conductive layer 22 may be lower than the top surface of the word line groove. That is to say, the surface of the conductive layer 22 may be lower than the surface of the substrate 1. In some embodiments of the disclosure, a material of the conductive layer 22 may be tungsten or titanium nitride. Definitely, the conductive layer may also be made of other materials with strong conductive performance, which is not enumerated herein.

The conductive layer 22 may be formed in the word line groove having the inter-gate dielectric layer 21 by means of vacuum evaporation, magnetron sputtering, atomic layer deposition, chemical vapor deposition or physical vapor deposition. Definitely, the conductive layer 22 may also be formed in other manners, and the manner of forming the conductive layer 22 is not specifically limited herein.

In some embodiments of the disclosure, the semiconductor structure of the disclosure may further include the protective layer 71. The protective layer 71 may be formed in the word line groove, which may be a thin film formed on a surface of the conductive layer 22, or may be a coating formed on the surface of the conductive layer 22. A specific form of the protective layer 71 is not specifically limited herein. A material of the protective layer 71 may be an insulation material. For example, the material may be SiCN. Insulation protection may be performed on the surface of the word line structure 2 by means of the protective layer 71, so that damage to the surface of the word line structure 2 caused by the follow-up process may be avoided, and the possibility of coupling or short circuit between the word line structure 2 and other surrounding structures may be reduced, thereby increasing product yield.

For example, the protective layer 71 may be formed on the surface of the conductive layer 22 by means of chemical vapor deposition, physical vapor deposition, atomic layer deposition, etc. It is to be noted that, a surface of the protective layer 71 away from the conductive layer 22 may be flush with the surface of the substrate 1.

Figure 3:
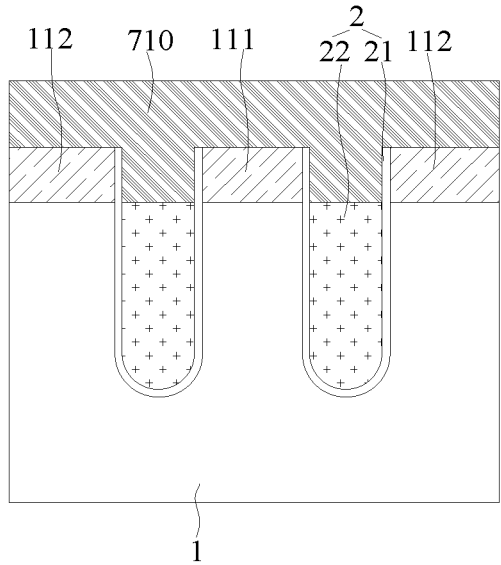
FIG. 3 is a schematic diagram of a protective material layer according to an embodiment of the disclosure.

In an exemplary embodiment of the disclosure, as shown in FIG. 3, in the process of forming the protective layer 71, a protective material layer 710 may be formed, by means of chemical vapor deposition, physical vapor deposition, atomic layer deposition and so on, on a surface of a structure formed by the substrate 1 and the conductive layer 22 together. The protective material layer 710 may fill the word line groove, and covers the surface of the substrate 1. Then, the protective material layer 710 in an area outside the word line groove may be removed by means of the etching process, and only the protective material layer 710 in the word line groove is retained, so that the protective material layer 710 in the word line groove may be defined as the protective layer 71.

Continuously referring to FIG. 1, a conductive contact structure 3 and a bit line contact structure 4 may be respectively formed on the top of the substrate 1. The conductive contact structure 3 and the bit line contact structure 4 may respectively be used as a source and a drain, and form an embedded transistor together with the word line structure 2, so that the integration level of a device can be enhanced.

For example, the conductive contact structure 3 and the bit line contact structure 4 may respectively be formed on tops of the source area 111 and the drain area 112 on the two sides of the word line groove. The bit line contact structure 4, the conductive contact structure 3 and the word line structure 2 may be separated from each other by means of the insulation material, so as to avoid the coupling or short circuit between structures. For example, the bit line contact structure 4, the conductive contact structure 3 and the word line structure 2 may be separated from each other through the protective layer 71, the passivation layer 7 or an insulation layer 8.

In an exemplary embodiment of the disclosure, the conductive contact structure 3 may extend in the direction perpendicular to the substrate 1, and an end portion of the conductive contact structure close to the substrate 1 may extend into the drain area 112. In the direction parallel to the substrate 1, a width of a portion of the conductive contact structure 3 extending into the drain area 112 may be less than a width of a portion of the conductive contact structure away from the substrate 1, so that a contact area between the conductive contact structure 3 and the drain area 112 can be decreased, thereby facilitating the reduction of contact resistance and increasing product yield. The conductive contact structure 3 may be made of a conductive material. For example, the material of the conductive contact structure 3 may be tungsten or titanium nitride. Definitely, the conductive contact structure may also be made of other materials with desirable conductive performance. The material of the conductive contact structure 3 is not specifically limited herein.

Figure 4:
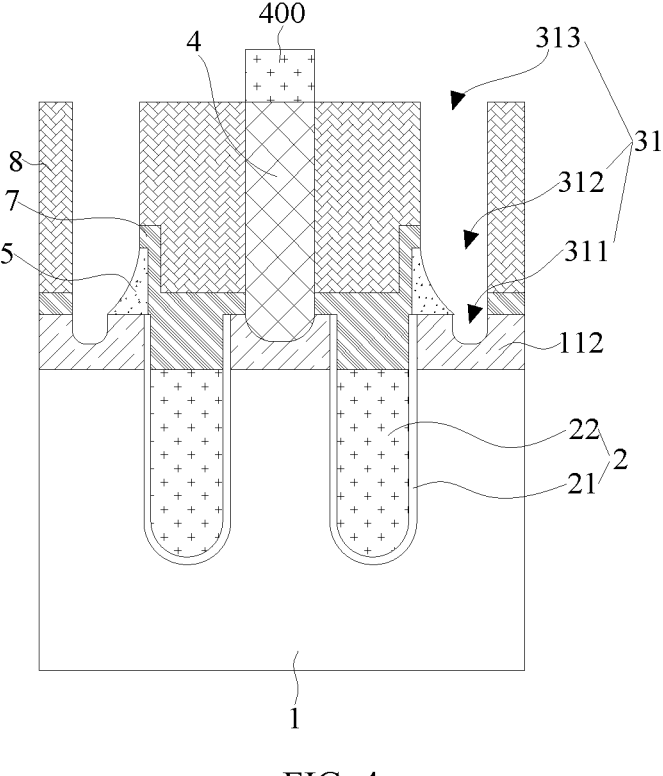
FIG. 4 is a schematic diagram of a capacitor contact hole according to an embodiment of the disclosure.
Figure 5:
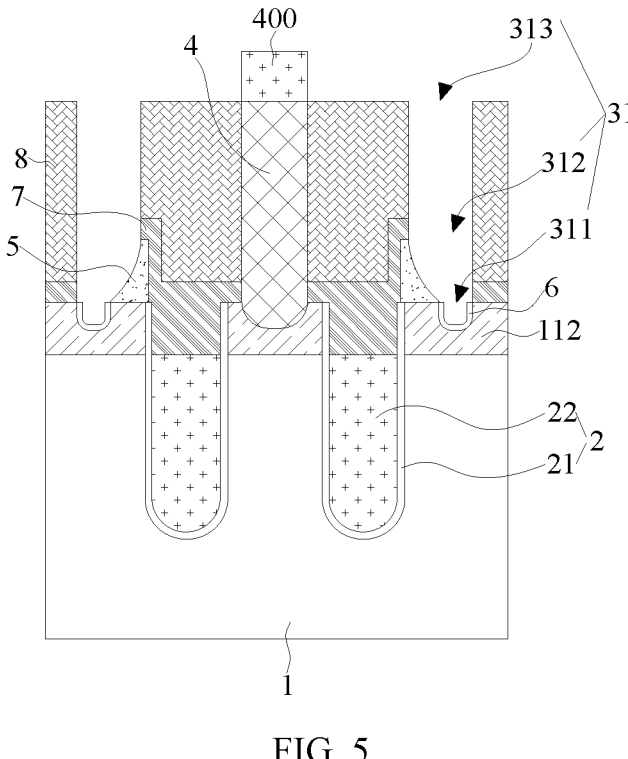
FIG. 5 is a schematic diagram of a conductive material layer according to an embodiment of the disclosure.

In some embodiments of the disclosure, as shown in FIG. 4, the drain area 112 may include a recessed portion 311 that is recessed inward from the top. Due to an etching selection ratio, and when there is the buffer layer 5 (for example, selecting SiC—Ti0), an excessively-deep etching depth of the surface of the substrate can be alleviated when the recessed portion 311 is formed, so that not only the GIDL current but also p-n junction leak current can be improved. For example, the drain area 112 may be etched by means of the etching process, so as to form the recessed portion 311 in the drain area 112. The semiconductor structure of the disclosure may further include a conductive material layer 6. FIG. 5 is a schematic diagram of the conductive material layer 6 according to an embodiment of the disclosure. As shown in FIG. 5, the conductive material layer 6 may be fitly attached to an inner wall of the recessed portion 311. The conductive material layer 6 may be a thin film that is fitly attached to the sidewall and bottom of the recessed portion 311, or may be a coating that is fitly attached to the sidewall and bottom of the recessed portion 311. The form of the conductive material layer 6 is not specifically limited herein. The conductive material layer 6 may be formed on the sidewall and surface of the recessed portion 311 by means of vacuum evaporation, magnetron sputtering, atomic layer deposition, chemical vapor deposition, physical vapor deposition, etc. Definitely, the conductive material layer 6 may also be formed in other manners, and the manner of forming the conductive material layer 6 is not specifically limited herein.

Continuously referring to FIG. 1, the end portion of the conductive contact structure 3 close to the substrate 1 may extend into the recessed portion 311, and is connected to the conductive material layer 6 in the recessed portion 311 in a contact manner. For example, the recessed portion 311 having the conductive material layer 6 may be filled with the conductive contact structure 3.

A material of the conductive material layer 6 may be different from the material of the conductive contact structure 3. In order to reduce the contact resistance, a resistance value of the material of the conductive material layer 6 may be less than a resistance value of the material of the conductive contact structure 3. For example, the material of the conductive contact structure 3 may be tungsten, and the material of the conductive material layer 6 may be silicon titanide or silicon nickel.

In an exemplary embodiment of the disclosure, the conductive contact structure 3 may extend in the direction perpendicular to the substrate 1, and an end portion of the conductive contact structure close to the substrate 1 may extend into the drain area 112. In the direction parallel to the substrate 1, a width of a portion of the conductive contact structure 3 extending into the drain area 112 may be less than a width of a portion of the conductive contact structure away from the substrate 1, so that a contact area between the conductive contact structure 3 and the drain area 112 can be decreased, thereby facilitating the reduction of contact resistance and improving the reliability of products. The conductive contact structure 3 may be made of a conductive material. For example, the material of the conductive contact structure 3 may be tungsten or titanium nitride. Definitely, the conductive contact structure may also be made of other materials with desirable conductive performance. The material of the conductive contact structure 3 is not specifically limited herein.

In some embodiments of the disclosure, as shown in FIG. 1, the bit line contact structure 4 may be connected to the source area 111. For example, the source area 111 may include a recess that is recessed inward from the top. For example, the source area 111 may be etched by means of the etching process, so as to form the recess in the source area 111. An end of the bit line contact structure 4 may extend into the recess, and may fill the recess. In an embodiment, the bit line contact structure 4 may extend in the direction perpendicular to the substrate 1. An orthographic projection of the bit line contact structure on the substrate 1 does not overlap with an orthographic projection of the conductive contact structure 3 on the substrate 1.

In an exemplary embodiment of the disclosure, the semiconductor structure of the disclosure may further include an ohmic contact layer. The ohmic contact layer may be fitly attached to the inner wall of the recess. The ohmic contact layer may be a thin film that is fitly attached to the sidewall and bottom of the recess, or may be a coating that is fitly attached to the sidewall and bottom of the recess. The specific form of the ohmic contact layer is not specifically limited herein. The ohmic contact layer may be formed on the sidewall and surface of the recess by means of vacuum evaporation, magnetron sputtering, atomic layer deposition, chemical vapor deposition, physical vapor deposition, etc. Definitely, the ohmic contact layer may also be formed in other manners, and the manner of forming the ohmic contact layer is not specifically limited herein.

It is to be noted that, the end portion of the bit line contact structure 4 close to the substrate 1 may extend into the recess, and is connected to the ohmic contact layer in the recess. For example, the recess having the ohmic contact layer may be filled with the bit line contact structure 4.

A material of the ohmic contact layer may be different from the material of the bit line contact structure 4. In order to reduce the contact resistance, a resistance value of the material of the ohmic contact layer may be less than a resistance value of the material of the bit line contact structure 4. For example, the material of the bit line contact structure 4 may be tungsten, and the material of the ohmic contact layer may be metal silicide, for example, cobalt silicide.

Figure 6:
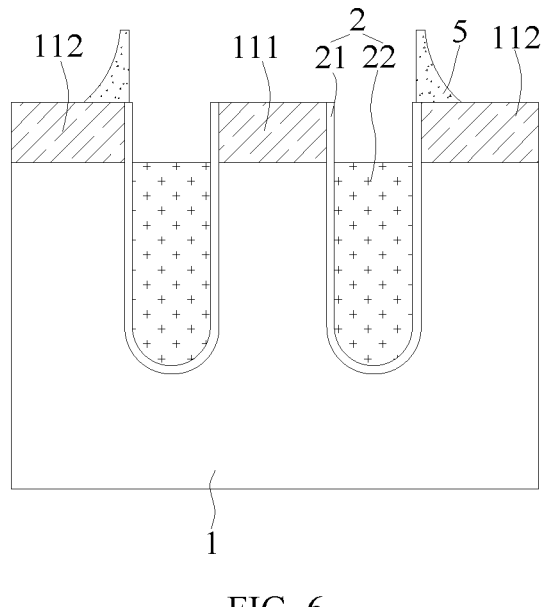
FIG. 6 is a schematic diagram of a buffer layer according to an embodiment of the disclosure.

In some embodiments of the disclosure, FIG. 6 is a schematic diagram of a buffer layer according to an embodiment of the disclosure. As shown in FIG. 6, the buffer layer 5 may be located between the conductive contact structure 3 and the bit line contact structure. For example, the buffer layer 5 may be formed on the surface of the drain area 112, and may be connected to the conductive contact structure 3 in a contact manner. In addition, the buffer layer 5 may also be disposed in an insulated manner with the word line structure 2. The buffer layer 5 in this embodiment of the disclosure may, for example, have an arcuate surface, so that the buffer layer can be fitly attached to the surface of the conductive contact structure 3, and the closer to the position of the word line structure 2, the larger the size of the buffer layer 5. In this embodiment of the disclosure, through the design of the buffer layer 5, the physical dimension between the word line structure 2 and the conductive contact structure 3 is increased, so that an electric field between a drain and a gate can be reduced, so as to reduce the GIDL current. In addition, due to the increasing of the physical dimension, in addition to effectively reducing stand-by power consumption and improving the reliability of the device, large interface leak current between the substrate and source-drain doping areas (p-n) caused by excessively deep depth can be effectively avoided during etching.

In an exemplary embodiment of the disclosure, the buffer layer 5 may be made of a conductive material. For example, the material of the buffer layer 5 may be titanium containing silicon carbide or nickel containing silicon carbide. These materials have good conductivity and adhesion, so that the performance of the buffer layer can be guaranteed. The buffer layer 5 may be formed on the surface of the drain area 112 by means of vacuum evaporation, magnetron sputtering, atomic layer deposition, chemical vapor deposition, physical vapor deposition, etc. Definitely, the buffer layer 5 may also be formed in other manners, and the manner of forming the buffer layer 5 is not specifically limited herein.

In an exemplary embodiment of the disclosure, the semiconductor structure of the disclosure may further include a passivation layer 7. FIG. 7 is a schematic diagram of the passivation layer 7 according to an embodiment of the disclosure. As shown in FIG. 7, the passivation layer 7 may cover the surfaces of the buffer layer 5 and the substrate 1. The passivation layer 7 fills the word line groove. The conductive contact structure 3 may penetrate the passivation layer 7, and is connected to the drain area 112. In addition, continuously referring to FIG. 1, the bit line contact structure 4 may penetrate the passivation layer 7, and is connected to the source area 111.

In some embodiments of the disclosure, continuously referring to FIG. 7, the passivation layer 7 may include a passivation material layer 72. The passivation material layer 72 may cover a surface of a structure formed by the substrate 1, the buffer layer 5 and the protective layer 71 together. The material of the passivation material layer may be an insulation material with a low dielectric constant. Continuously referring to FIG. 1, the conductive contact structure 3 may penetrate the passivation material layer 72, and is connected to the drain area 112. In addition, the bit line contact structure 4 may penetrate the passivation material layer 72, and is connected to the source area 111. Therefore, parasitic capacitance between the word line structure 2 and the conductive contact structure 3 and the bit line contact structure 4 can be reduced by means of the passivation material layer 72 with the low dielectric constant.

For example, the material of the passivation material layer 72 may be the same as the material of the protective layer 71. For example, the material of the passivation material layer may be SiCN. The passivation material layer 72 may be formed, by means of atomic layer deposition, chemical vapor deposition, physical vapor deposition, etc., on the surface of the structure that is formed by the substrate 1, the buffer layer 5 and the protective layer 71 together. Definitely, the passivation material layer 72 may also be formed in other manners, and the manner of forming the passivation material layer 72 is not specifically limited herein. In some embodiments of the disclosure, the protective layer 71 and the passivation material layer 72 may jointly form the passivation layer 7. The passivation layer 7 may be made of a material with a low dielectric constant, so that the parasitic capacitance between the word line structure 2 and the bit line contact structure 4 and the conductive contact structure 3 can be reduced through the passivation layer 7.

In an exemplary embodiment of the disclosure, referring to FIG. 4 and FIG. 5, the semiconductor structure of the disclosure may further include an insulation layer 8. The insulation layer 8 may cover a surface of the passivation layer 7. The conductive contact structure 3 may penetrate the insulation layer 8 and the passivation layer 7, and is connected to the drain area 112. In addition, the bit line contact structure 4 may penetrate the insulation layer 8 and the passivation layer 7, and is connected to the source area 111.

In some embodiments of the disclosure, a material of the insulation layer 8 may be an insulation material. Double insulation protection may be performed on the surface of the word line structure 2 through the insulation layer 8 and the passivation layer 7, so that the coupling or short circuit between the word line structure 2 and other structures can be avoided, thereby increasing product yield. In addition, the bit line contact structure 4 and the conductive contact structure 3 may be separated through the insulation layer 8, so that the coupling or short circuit between the bit line contact structure 4 and the conductive contact structure 3 can be avoided, thereby further increasing product yield. For example, the material of the insulation layer 8 may be silicon oxide.

For example, the insulation layer 8 may be formed on the surface of the passivation layer 7 by means of atomic layer deposition, chemical vapor deposition, physical vapor deposition, vacuum evaporation, magnetron sputtering, etc. Definitely, the insulation layer 8 may also be formed in other manners, and the manner of forming the insulation layer 8 is not specifically limited herein.

An embodiment of the disclosure further provides a method for forming a semiconductor structure. FIG. 8 is a flowchart of a method for forming a semiconductor structure according to an embodiment of the disclosure. Referring to FIG. 8, the method may include S110 to S140.

At S110, a substrate is provided. The substrate includes an active area. The active area includes a channel area, and a source area and a drain area that are respectively distributed on two sides of the channel area. The channel area has a word line groove.

At S120, a word line structure is formed in the word line groove.

At S130, a conductive contact structure is formed on a top of the drain area. The conductive contact structure is connected to the drain area.

At S140, a buffer layer is formed between the conductive contact structure and the word line structure.

In the method for forming a semiconductor structure in the disclosure, the conductive contact structure 3 may be used as a drain, and forms an embedded transistor together with the word line structure 2 and the subsequently-formed bit line contact structure 4, so that the integration level of a device can be enhanced. In addition, since the buffer layer is located between the conductive contact structure 3 and the word line structure 2, a physical dimension between the word line structure 2 and the conductive contact structure 3 is increased, so that an electric field between a drain and a gate can be reduced, so as to reduce a GIDL current. In addition, due to the increasing of the physical dimension, in addition to effectively reducing stand-by power consumption and improving the reliability of the device, large interface leak current between the substrate and source-drain doping areas (p-n) caused by excessively deep depth can be effectively avoided during etching.

Operations of the method for forming a semiconductor structure according to the disclosure are described in detail below.

In S110, the substrate 1 is provided. The substrate 1 includes an active area 11. The active area 11 includes a channel area, and a source area 111 and a drain area 112 that are respectively distributed on two sides of the channel area. The channel area has a word line groove.

As shown in FIG. 1, the substrate 1 may be of a flat-plate structure, which may be a rectangle, a circle, an ellipse, a polygon, or an irregular shape. A material of the substrate may be a semiconductor material, for example, may be silicon, but is not limited to the silicon or other semiconductor materials, and the shape and material of the substrate 1 are not specifically limited thereto.

In an embodiment, the substrate 1 may be a silicon substrate, and a plurality of shallow trench isolation structures (not shown in the figure) are formed in the substrate. The shallow trench isolation structures may be formed by first forming grooves in the substrate 1 and then filling insulation material layers in the grooves. A material of the shallow trench isolation structure may include silicon nitride or silicon oxide, which is not specially limited herein. A shape of a cross section of the shallow trench isolation structure may be designed according to actual requirements. The plurality of shallow trench isolation structures may be distributed side by side, and can isolate a plurality of active areas 11 on the substrate 1. Each active area 11 may include a first doping area and a second doping area that are arranged in a spaced manner.

The substrate 1 may be p-type substrate. The first doping area and the second doping area may be doped to respectively form a source area 111 and a drain area 112. For example, n-type doping may be performed on the first doping area and the second doping area, so as to form an n-type doping area. The n-type doping area may be form a p-n junction with the p-type substrate.

It is to be noted that, there may be a channel area (not shown in the figure) between the source area 111 and the drain area 112 (that is, the active area 11 may include the channel area, and the source area 111 and the drain area 112 that are respectively distributed on two sides of the channel area). A current may flow in the channel area. The current in the channel area may be controlled by a voltage of the word line structure 2 that is subsequently formed in the channel area, so as to achieve a gate-control function.

In an exemplary embodiment of the disclosure, a word line groove may be formed in the channel area and may be configured to form the word line structure 2. For example, the substrate 1 may be etched to form the word line groove. The word line groove is penetrable on two ends and may be in a strip shape. The word line groove may penetrate a plurality of active areas 11, and portions of the word line groove penetrating the active areas 11 and within the active areas may be located in the channel areas of the active areas 11.

For example, a photoresist layer may be formed on a surface of the substrate 1 through spin coating or other manners. A material of the photoresist layer may be a positive photoresist or a negative photoresist, which is not particularly limited herein.

The photoresist layer may be exposed by using a mask. A pattern of the mask may match a pattern required for the word line groove. Then, the exposed photoresist layer may be developed to form a development area. Each development area may expose the surface of the substrate 1. A pattern of the development area may be the same as the pattern required for the word line groove. A size of the development area may match a size required for the word line groove.

By means of a plasma etching process, the substrate 1 may be etched in the development area, so as to form the word line groove in the substrate 1. After the etching process is completed, the photoresist layer may be cleaned by means of a cleaning solution or removed by means of processes such as ashing, so that the substrate 1 having the word line groove is exposed.

In S120, the word line structure 2 is formed in the word line groove.

The word line structure 2 may be located in the word line groove. In some embodiments of the disclosure, a top of the word line structure 2 may be lower than a top surface of the word line groove, so as to leave space for a protective layer 71 that is subsequently formed. That is to say, the word line structure 2 may be formed in the word line groove.

In an exemplary embodiment of the disclosure, the operation (that is, S120) of forming the word line structure 2 in the word line groove may include S210 and S220.

At S210, a fitly-attached inter-gate dielectric layer 21 is formed in the word line groove.

The fitly attached inter-gate dielectric layers 21 may be formed on a sidewall and bottom of each word line groove. A material of the inter-gate dielectric layer 21 may include silicon oxide, silicon nitride, silicon oxynitride and the like, or may be a combination of the foregoing materials. A thickness of the inter-gate dielectric layer may range from 1 nm to 9 nm, for example, may be 1 nm, 2 nm, 4 nm, 6 nm, 8 nm, or 9 nm. Definitely, there may be other thicknesses, which are not enumerated herein.

For example, the fitly attached inter-gate dielectric layers 21 may be formed on the sidewall and bottom of each word line groove by means of chemical vapor deposition, physical vapor deposition, atomic layer deposition, thermal evaporation, thermal oxidation, etc. Definitely, the inter-gate dielectric layer 21 may be formed in other manners, which is not specially limited herein. For ease of process, in a process of forming the inter-gate dielectric layer 21, the inter-gate dielectric layer 21 may completely cover the top surface of the substrate 1. Then, the inter-gate dielectric layer 21 on the top surface of the substrate 1 may be removed, and only the inter-gate dielectric layers 21 on the sidewall and bottom of each word line groove are retained.

In some embodiments of the disclosure, a surface of the inter-gate dielectric layer 21 may be processed by means of a thermal oxidation process, to improve the compactness of a film layer of the inter-gate dielectric layer 21, so that leak current can be reduced, gate-control capabilities can be enhanced, the effect of the inter-gate dielectric layer 21 to block impurities in the substrate 1 can be enhanced, and the impurities in the substrate 1 can be prevented from diffusing into the word line groove, thereby improving the stability of a structure.

At S220, a conductive layer 22 is formed in the word line groove having the inter-gate dielectric layer 21, and a surface of the conductive layer 22 is lower than the surface of the substrate 1.

In an exemplary embodiment of the disclosure, referring to FIG. 2, the conductive layer 22 may fill the word line groove having the inter-gate dielectric layer 21. A surface of the conductive layer 22 may be lower than the top surface of the word line groove. That is to say, the surface of the conductive layer 22 may be lower than the surface of the substrate 1. In some embodiments of the disclosure, a material of the conductive layer 22 may be tungsten or titanium nitride. Definitely, the conductive layer may also be made of other conductive materials, which is not enumerated herein.

The conductive layer 22 may be formed in the word line groove having the inter-gate dielectric layer 21 by means of vacuum evaporation, magnetron sputtering, atomic layer deposition, chemical vapor deposition, physical vapor deposition, etc. Definitely, the conductive layer 22 may also be formed in other manners, and the manner of forming the conductive layer 22 is not specifically limited herein.

In S130, the conductive contact structure 3 is formed on the top of the drain area 112. The conductive contact structure 3 is connected to the drain area 112.

Continuously referring to FIG. 1, in the embodiments of the disclosure, a drain and a source form an embedded transistor together with the word line structure 2, so that the integration level of a device can be enhanced.

In an exemplary embodiment of the disclosure, the conductive contact structure 3 may be formed on the top of the drain area 112. The conductive contact structure 3 may extend in the direction perpendicular to the substrate 1, and an end portion of the conductive contact structure close to the substrate 1 may extend into the drain area 112. In the direction parallel to the substrate 1, a width of a portion of the conductive contact structure 3 extending into the drain area 112 may be less than a width of a portion of the conductive contact structure away from the substrate 1, so that a contact area between the conductive contact structure 3 and the drain area 112 can be decreased, thereby facilitating the reduction of contact resistance and increasing product yield. The conductive contact structure 3 may be made of a conductive material. For example, the material of the conductive contact structure may be tungsten or titanium nitride. Definitely, the conductive contact structure may also be made of other materials with desirable conductive performance. The material of the conductive contact structure 3 is not specifically limited herein.

In some embodiments of the disclosure, as shown in FIG. 4, the drain area 112 may include a recessed portion 311 that is recessed inward from the top. For example, the drain area 112 may be etched by means of the etching process, so as to form the recessed portion 311 in the drain area 112. The method for forming a semiconductor structure may further include the following operations.

At S150, a conductive material layer 6 fitly attached to an inner wall of the recessed portion 311 is formed. The conductive contact structure 3 extends in a direction perpendicular to the substrate 1. An end portion of the conductive material layer close to the substrate 1 extends into the recessed portion 311 and fills the recessed portion 311 having the conductive material layer 6.

FIG. 5 is a schematic diagram of the conductive material layer 6 according to an embodiment of the disclosure. As shown in FIG. 5, the conductive material layer 6 may be fitly attached to an inner wall of the recessed portion 311. The conductive material layer 6 may be a thin film that is fitly attached to the sidewall and bottom of the recessed portion 311, or may be a coating that is fitly attached to the sidewall and bottom of the recessed portion 311. The form of the conductive material layer 6 is not specifically limited herein. The conductive material layer 6 may be formed on the sidewall and surface of the recessed portion 311 by means of vacuum evaporation, magnetron sputtering, atomic layer deposition, chemical vapor deposition, physical vapor deposition, etc. Definitely, the conductive material layer 6 may also be formed in other manners, and the manner of forming the conductive material layer 6 is not specifically limited herein.

Continuously referring to FIG. 1, the end portion of the conductive contact structure 3 close to the substrate 1 may extend into the recessed portion 311, and is connected to the conductive material layer 6 in the recessed portion 311 in a contact manner. For example, the recessed portion 311 having the conductive material layer 6 may be filled with the conductive contact structure 3.

A material of the conductive material layer 6 may be different from the material of the conductive contact structure 3. In order to reduce the contact resistance, a resistance value of the material of the conductive material layer 6 may be less than a resistance value of the material of the conductive contact structure 3. For example, the material of the conductive contact structure 3 may be tungsten, and the material of the conductive material layer 6 may be silicon titanide or silicon nickel.

In an exemplary embodiment of the disclosure, the conductive contact structure 3 may extend in the direction perpendicular to the substrate 1, and an end portion of the conductive contact structure close to the substrate 1 may extend into the drain area 112. In the direction parallel to the substrate 1, a width of a portion of the conductive contact structure 3 extending into the drain area 112 may be less than a width of a portion of the conductive contact structure away from the substrate 1, so that a contact area between the conductive contact structure 3 and the drain area 112 can be decreased, thereby facilitating the reduction of contact resistance and improving the reliability of products. The conductive contact structure 3 may be made of a conductive material. For example, the material may be tungsten or titanium nitride. Definitely, the conductive contact structure may also be made of other materials with desirable conductive performance. The material of the conductive contact structure 3 is not specifically limited herein.

In some embodiments of the disclosure, the method for forming a semiconductor structure may further include the following operations.

At S160, a bit line contact structure 4 is formed on a top of the source area 111. The bit line contact structure 4 penetrates the insulation layer 8 and the passivation layer 7 and connected to the source area 111, and an orthographic projection of the bit line contact structure 4 on the substrate 1 does not overlap with an orthographic projection of the conductive contact structure 3 on the substrate 1.

Continuously referring to FIG. 1, the bit line contact structure 4 may be connected to the source area 111. For example, the source area 111 may include a recess that is recessed inward from the top. For example, the source area 111 may be etched by means of the etching process, so as to form the recess in the source area 111. An end of the bit line contact structure 4 may extend into the recess, and may fill the recess. In an embodiment, the bit line contact structure 4 may extend in the direction perpendicular to the substrate 1. An orthographic projection of the bit line contact structure on the substrate 1 does not overlap with an orthographic projection of the conductive contact structure 3 on the substrate 1.

In an exemplary embodiment of the disclosure, the method for forming a semiconductor structure may further include the following operations.

At S170, an ohmic contact layer fitly attached to the inner wall of the recess is formed.

The ohmic contact layer may be a thin film that is fitly attached to the sidewall and bottom of the recess, or may be a coating that is fitly attached to the sidewall and bottom of the recess. The specific form of the ohmic contact layer is not specifically limited herein. The ohmic contact layer may be formed on the sidewall and surface of the recess by means of vacuum evaporation, magnetron sputtering, atomic layer deposition, chemical vapor deposition, physical vapor deposition, etc. Definitely, the ohmic contact layer may also be formed in other manners, and the manner of forming the ohmic contact layer is not specifically limited herein.

It is to be noted that, the end portion of the bit line contact structure 4 close to the substrate 1 may extend into the recess, and is connected to the ohmic contact layer in the recess in contact manner. For example, the recess having the ohmic contact layer may be filled with the bit line contact structure 4.

A material of the ohmic contact layer may be different from the material of the bit line contact structure 4. In order to reduce the contact resistance, a resistance value of the material of the ohmic contact layer may be less than a resistance value of the material of the bit line contact structure 4. For example, the material of the bit line contact structure 4 may be tungsten, and the material of the ohmic contact layer may be metal silicide, for example, cobalt silicide.

In S140, the buffer layer 5 is formed between the conductive contact structure 3 and the word line structure 2.

FIG. 6 is a schematic diagram of a buffer layer according to an embodiment of the disclosure. As shown in FIG. 6, the buffer layer 5 may be formed on the surface of the drain area 112, which may be connected to the conductive contact structure 3 in a contact manner. In addition, the buffer layer 5 may also be disposed in an insulated manner with the word line structure 2. The buffer layer 5 in this embodiment of the disclosure may, for example, have an arcuate surface, so that the buffer layer can be fitly attached to the surface of the conductive contact structure 3, and the closer to the position of the word line structure 2, the larger the size of the buffer layer 5. In this embodiment of the disclosure, through the design of the buffer layer 5, the physical dimension between the word line structure 2 and the conductive contact structure 3 is increased, so that an electric field between a drain and a gate can be reduced, so as to reduce the GIDL current. In addition, due to the increasing of the physical dimension, in addition to effectively reducing stand-by power consumption and improving the reliability of the device, large interface leak current between the substrate and source-drain doping areas (p-n) caused by excessively deep depth can be effectively avoided during etching.

In an exemplary embodiment of the disclosure, the buffer layer 5 may be made of a conductive material. For example, the material may be titanium containing silicon carbide or nickel containing silicon carbide. These materials have good conductivity and adhesion, so that the performance of the buffer layer can be guaranteed. The buffer layer 5 may be formed on the surface of the drain area 112 by means of vacuum evaporation, magnetron sputtering, atomic layer deposition, chemical vapor deposition, physical vapor deposition, etc. Definitely, the buffer layer 5 may also be formed in other manners, and the manner of forming the buffer layer 5 is not specifically limited herein.

In an exemplary embodiment of the disclosure, the method for forming a semiconductor structure may further include the following operations.

At S180, a passivation layer 7 covering the buffer layer 5 and a surface of the substrate 1 is formed. The passivation layer 7 fills the word line groove.

FIG. 7 is a schematic diagram of the passivation layer 7 according to an embodiment of the disclosure. As shown in FIG. 7, the passivation layer 7 may cover the surfaces of the buffer layer 5 and the substrate 1. The passivation layer 7 fills the word line groove. The conductive contact structure 3 may penetrate the passivation layer 7, and is connected to the drain area 112. In addition, continuously referring to FIG. 1, the bit line contact structure 4 may penetrate the passivation layer 7, and is connected to the source area 111.

In some embodiments of the disclosure, the operation (that is, S180) of forming the passivation layer 7 covering the surfaces of the buffer layer 5 and the substrate 1, where the passivation layer 7 fills the word line groove, may include S310 and S320.

At S310, a protective layer 71 covering the surface of the word line structure 2 is formed, and a surface of the protective layer is flush with the surface of the substrate 1.

The protective layer 71 may be formed in the word line groove, which may be a thin film formed on a surface of the conductive layer 22, or may be a coating formed on the surface of the conductive layer 22. A specific form of the protective layer 71 is not specifically limited herein. A material of the protective layer 71 may be an insulation material. For example, the material of the protective layer may be SiCN. Insulation protection may be performed on the surface of the word line structure 2 through the protective layer 71, so that damage to the surface of the word line structure 2 caused by the follow-up process may be avoided, and the possibility of coupling or short circuit between the word line structure 2 and other surrounding structures may be reduced, thereby increasing product yield.

For example, a material of the protective layer 71 may be silicon oxide or silicon nitride. The protective layer 71 may be formed on the surface of the conductive layer 22 by means of chemical vapor deposition, physical vapor deposition, atomic layer deposition, etc. It is to be noted that, a surface of the protective layer 71 away from the conductive layer 22 may be flush with the surface of the substrate 1.

In an exemplary embodiment of the disclosure, as shown in FIG. 3, in the process of forming the protective layer 71, a protective material layer 710 may be formed, by means of chemical vapor deposition, physical vapor deposition, atomic layer deposition, etc., on a surface of a structure formed by the substrate 1 and the conductive layer 22 together. The protective material layer 710 may fill the word line groove, and covers the surface of the substrate 1. Then, the protective material layer 710 of an area outside the word line groove may be removed by means of the etching process, and only the protective material layer 710 in the word line groove is retained, so that the remaining protective material layer 710 in the word line groove may be defined as the protective layer 71.

At S320, a passivation material layer 72 is formed on a surface of a structure that is formed by the substrate 1, the buffer layer 5 and the protective layer 71 together.

Continuously referring to FIG. 7, the passivation material layer 72 may cover a surface of a structure formed by the substrate 1, the buffer layer 5 and the protective layer 71 together. The material of the passivation material layer may be an insulation material with a low dielectric constant. Continuously referring to FIG. 1, the conductive contact structure 3 may penetrate the passivation material layer 72, and is connected to the drain area 112. In addition, the bit line contact structure 4 may penetrate the passivation material layer 72, and is connected to the source area 111. Therefore, parasitic capacitance between the word line structure 2 and the conductive contact structure 3 and the bit line contact structure 4 can be reduced by means of the passivation material layer 72 with the low dielectric constant.

For example, the material of the passivation material layer 72 may be the same as the material of the protective layer 71. For example, the material of the passivation material layer may be SiCN. The passivation material layer 72 may be formed, by means of atomic layer deposition, chemical vapor deposition, physical vapor deposition, etc., on the surface of the structure that is formed by the substrate 1, the buffer layer 5 and the protective layer 71 together. Definitely, the passivation material layer 72 may also be formed in other manners, and the manner of forming the passivation material layer 72 is not specifically limited herein. In some embodiments of the disclosure, the protective layer 71 and the passivation material layer 72 may jointly form the passivation layer 7. The passivation layer 7 may be made of a material with a low dielectric constant, so that the parasitic capacitance between the word line structure 2 and the bit line contact structure 4 and the conductive contact structure 3 can be reduced by means of the passivation layer 7.

In an exemplary embodiment of the disclosure, the method for forming a semiconductor structure may further include the following steps.

At S190, an insulation layer 8 covering a surface of the passivation layer 7 is formed. The conductive contact structure 3 can penetrate the insulation layer 8 and the passivation layer 7, and fill the recessed portion 311 having the conductive material layer 6.

Referring to FIG. 4 and FIG. 5, the insulation layer 8 may cover the surface of the passivation layer 7. The conductive contact structure 3 may penetrate the insulation layer 8 and the passivation layer 7, and is connected to the drain area 112. In addition, the bit line contact structure 4 may penetrate the insulation layer 8 and the passivation layer 7, and is connected to the source area 111.

In some embodiments of the disclosure, a material of the insulation layer 8 may be an insulation material. Double insulation protection may be performed on the surface of the word line structure 2 by means of the insulation layer 8 and the passivation layer 7, so that the coupling or short circuit between the word line structure 2 and other structures can be avoided, thereby increasing product yield. In addition, the bit line contact structure 4 and the conductive contact structure 3 may be separated through the insulation layer 8, so that the coupling or short circuit between the bit line contact structure 4 and the conductive contact structure 3 can be avoided, thereby further increasing product yield. For example, the material of the insulation layer 8 may be silicon oxide.

For example, the insulation layer 8 may be formed on the surface of the passivation layer 7 by means of atomic layer deposition, chemical vapor deposition, physical vapor deposition, vacuum evaporation, magnetron sputtering, etc. Definitely, the insulation layer 8 may also be formed in other manners, and the manner of forming the insulation layer 8 is not specifically limited herein.

In an exemplary embodiment of the disclosure, the operation of forming the conductive contact structure 3, which is connected to the drain area 112, on the top of the drain area 112 may include S410 and S420.

At S410, the insulation layer 8, the passivation layer 7 and the drain area 112 are etched, so as to form a capacitor contact hole 31. The capacitor contact hole 31 includes the recessed portion 311 formed in the drain area 112, a first hole section 312 exposing the buffer layer 5 and a second hole section 313 formed on a side of the first hole section 312 away from the recessed portion 311. In a direction perpendicular to the substrate 1, the recessed portion 311, the first hole section 312 and the second hole section 313 successively interfaced. In a direction parallel to the substrate 1, a width of the recessed portion 311 is less than a width of the first hole section 312 and/or a width of the second hole section 313.

In some embodiments of the disclosure, after the passivation layer 7 and the insulation layer 8 are formed, the conductive contact structure 3 and the bit line contact structure 4 may be formed. After the bit line contact structure 4 is formed, a bit line 400 may be formed on the side of the bit line contact structure 4 away from the substrate 1. For example, anisotropic etching may be performed on the insulation layer 8, the passivation layer 7 and the drain area 112 of the substrate 1, so as to form the capacitor contact hole 31. FIG. 4 is a schematic diagram of the capacitor contact hole 31 according to an embodiment of the disclosure. As shown in FIG. 4, the capacitor contact hole 31 may be a blind hole. For example, the capacitor contact hole 31 may penetrate the insulation layer 8 and the passivation layer 7, and may extend to the drain area 112 of the substrate 1. The capacitor contact hole 31 does not penetrate the drain area 112 of the substrate 1, and a portion of the capacitor contact hole extending into the drain area 112 is distributed in a spaced manner with the channel area.

In an exemplary embodiment of the disclosure, the capacitor contact hole 31 may include the recessed portion 311, the first hole section 312 and the second hole section 313. In the direction perpendicular to the substrate 1, the recessed portion 311, the first hole section 312 and the second hole section 313 may successively interfaced, so as to form the capacitor contact holes 31 that successively communicate with each other. For example, the recessed portion 311 may be located in the source area 111 of the substrate 1, an opening of the recessed portion 311 may face a side where the passivation layer 7 and the insulation layer 8 are located. The first hole section 312 may penetrate the passivation layer 7, and passes through partial thickness of the insulation layer 8. The first hole section 312 may include a first open end and a second open end that communicate with each other. The first open end may interface with an opening of the recessed portion 311. The second open end may extend toward, in the direction perpendicular to the substrate 1, a side away from the first open end. The sidewall of the first hole section 312 may be expose the buffer layer 5, so that the conductive contact structure 3 subsequently formed in the second hole section 313 is connected to the buffer layer 5 in a contact manner, thereby improving the performance of the semiconductor structure. The second hole section 313 may be a via, of which one end may be flush with the surface of the insulation layer 8, and the other end may interface with the second open end of the first hole section 312.

In some embodiments of the disclosure, in the direction parallel to the substrate 1, a width of the recessed portion 311 located in the drain area 112 may be less than the width of the first hole section 312 and/or the width of the second hole section 313, so that a contact area between the conductive contact structure 3 subsequently formed in the recessed portion and the substrate 1 can be decreased, thereby reducing contact resistance.

At S420, the capacitor contact hole 31 is filled with a conductive material, so as to form the conductive contact structure 3.

The capacitor contact hole 31 may be filled with the conductive material by means of vacuum evaporation, magnetron sputtering, atomic layer deposition, chemical vapor deposition, physical vapor deposition, etc., so as to form the conductive contact structure 3. In an embodiment, the conductive material may be tungsten. Definitely, the conductive material may also be other materials with strong conductive performance, which is not enumerated herein.

It is to be noted that, the capacitor contact hole 31 may be filled with the conductive material. That is to say, the surface of the conductive contact structure 3 may be flush with the surface of the substrate 1. In the direction parallel to the substrate 1, the width of the portion of the conductive contact structure 3 located in the drain area 112 is less than the width of the portion of the conductive contact structure outside the substrate 1, so that the contact area between the conductive contact structure 3 and the substrate 1 can be decreased, thereby reducing contact resistance.

It is to be noted that, before the conductive contact structure is formed, a conductive material layer 6 may be formed in the recessed portion 311 of the drain area 112. For example, after the capacitor contact hole 31 is formed, a fitly-attached metal conductive layer 22 may be formed in the recessed portion 311. A material of the metal conductive layer 22 may be titanium or nickel. Then, the metal conductive layer 22 may be annealed. During annealing, the titanium or nickel in the metal conductive layer 22 may react with silicon in the substrate 1, so as to form the conductive material layer 6. When the substrate 1 is the silicon substrate, the material of the conductive material layer 6 may be silicon titanide or silicon nickel.

In an exemplary embodiment of the disclosure, the operation (that is, S140) of forming the buffer layer 5 between the conductive contact structure 3 and the word line structure 2 may include S510 to S550.

At S510, a first mask layer 9 is formed on the surface of the substrate 1. An orthographic projection of the first mask layer 9 on the substrate 1 does not overlap with an orthographic projection of the drain area 112 on the substrate 1.

Figure 9:
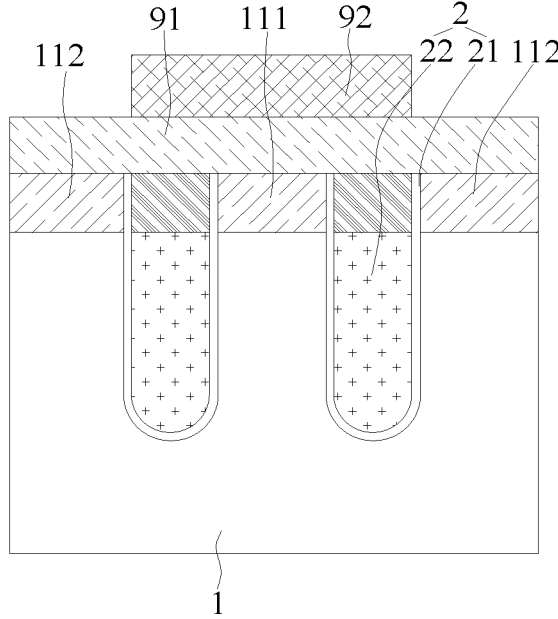
FIG. 9 is a schematic diagram of a mask material layer according to an embodiment of the disclosure.

In some embodiments of the disclosure, a mask material layer 91 may be formed on the surface of the substrate 1 by means of chemical vapor deposition, physical vapor deposition, vacuum evaporation, magnetron sputtering, atomic layer deposition or other manners. The mask material layer 91 may be a multilayer film layer structure, or may be a single-layer film layer structure. A material of the mask material layer may be at least one of polymer, $SiO_2$, SiN, polysilicon or SiCN. Definitely, the material may be other materials, which is not enumerated herein. FIG. 9 is a schematic diagram of a mask material layer 91 according to an embodiment of the disclosure.

In some embodiments, the mask material layer 91 may include a plurality of layers, which may include a polymer layer, an oxide layer and a hard mask layer. The polymer layer may be formed on the surface of the substrate 1, and the oxide layer may be located between the hard mask layer and the polymer layer. The polymer layer may be formed on the surface of the substrate 1 by means of a chemical vapor deposition process. The oxide layer may be formed on a surface of the polymer layer by means of a vacuum evaporation process. The hard mask layer may be formed on a surface of the oxide layer by means of an atomic layer deposition process.

A photoresist layer 92 may be formed on a surface of the mask material layer 91 away from a base by means of spin coating or other manners. A material of the photoresist layer 92 may be a positive photoresist or a negative photoresist, which is not particularly limited herein.

The photoresist layer 92 may be exposed by using a mask. An orthographic projection of a pattern of the mask on the substrate 1 may at least partially overlap with the drain area 112. Then, the exposed photoresist layer 92 may be developed to form a plurality of development areas that are distributed in a spaced manner. Each development area may expose the surface of the mask material layer 91. A pattern of the development areas may be the same as a pattern required for the first mask layer 9. A size of the development area may be the same as a size required for the first mask layer 9.

The mask material layer 91 may be etched in each development area by means of an anisotropic etching process, and the etched area may expose the substrate 1, so that a plurality of mask patterns are formed on the mask material layer 91, and the mask material layer 91 having the mask patterns may be defined as the first mask layer 9. It is to be noted that, when the mask material layer 91 is the single-layer structure, the mask patterns may be formed by means of one-time etching process. When the mask material layer 91 is the multilayer structure, the film layers may be layered for etching. That is to say, one layer may be etched by means of the one-time etching process, and the mask material layer 91 may be fully etched by using the etching process for a plurality of times, so as to form the mask patterns. In an embodiment, the shapes and sizes of the mask patterns may be the same as the pattern and size required for each first mask layer 9.

Figure 10:
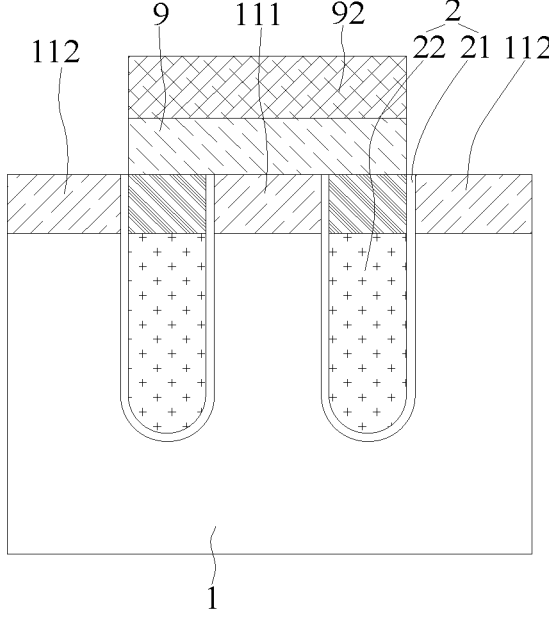
FIG. 10 is a schematic diagram after S510 is completed according to an embodiment of the disclosure.

It is to be noted that, after the etching process is completed, the photoresist layer 92 may be cleaned by means of a cleaning solution or removed by means of processes such as ashing, so that the etched first mask layer 9 is no longer covered by the photoresist layer 92. FIG. 10 is a schematic diagram after S510 is completed according to an embodiment of the disclosure.

At S520, a buffer material layer 51 is formed on a surface of a structure that is formed by the first mask layer 9 and the substrate 1 together.

Figure 11:
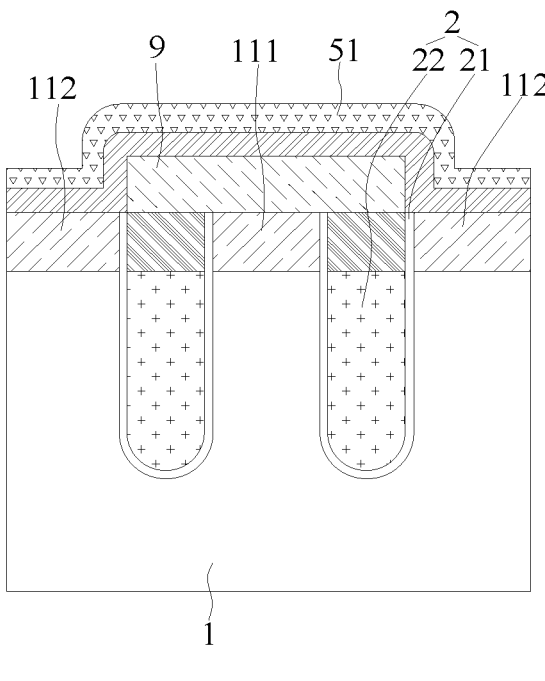
FIG. 11 is a schematic diagram after S520 is completed according to an embodiment of the disclosure.

The buffer material layer 51 may be formed, by means of chemical vapor deposition, physical vapor deposition, vacuum evaporation, magnetron sputtering, atomic layer deposition or other manners, on the surface of the structure that is formed by the first mask layer 9 and the substrate 1 together. The buffer material layer 51 may at least cover the sidewall and surface of the first mask layer 9. In some embodiments of the disclosure, a material of the buffer material layer 51 may be silicon carbide. FIG. 11 is a schematic diagram after S520 is completed according to an embodiment of the disclosure.

At S530, the buffer material layer 51 is etched, and only the buffer material layer 51 located on the sidewall of the first mask layer 9 is retained.

Figure 12:
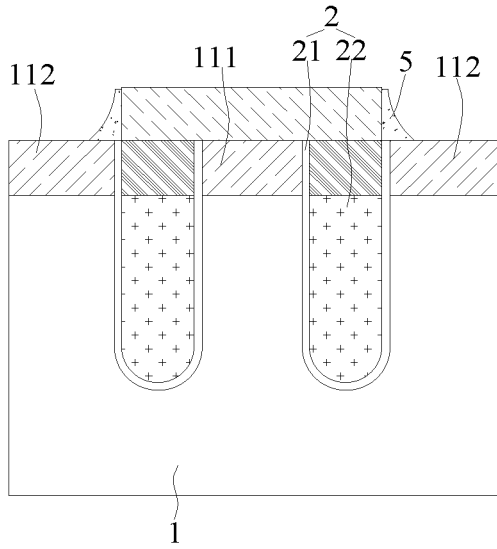
FIG. 12 is a schematic diagram after S530 is completed according to an embodiment of the disclosure.
Figure 13:
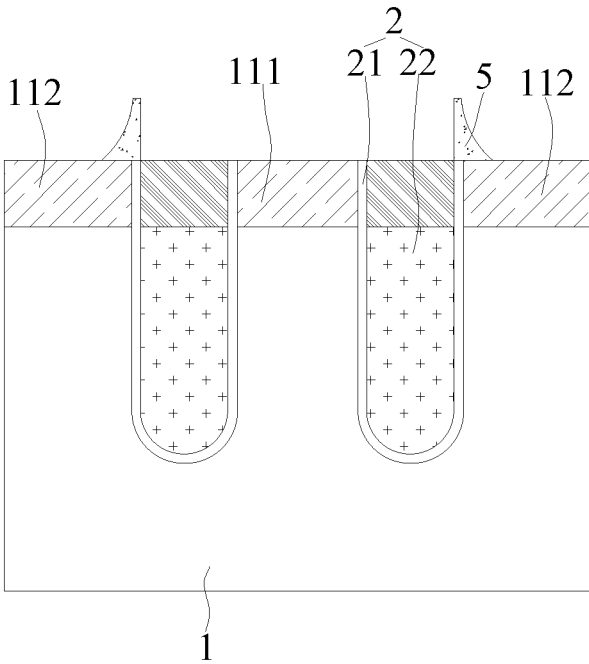
FIG. 13 is a schematic diagram after S540 is completed according to an embodiment of the disclosure.

The buffer material layer 51 may be etched by means of a dry etching process, so as to remove the portion of the buffer material layer 51 outside the sidewall of the first mask layer 9, and only the buffer material layer 51 on the sidewall of the first mask layer 9 is retained. It is to be noted that, in the process of removing the buffer material layer 51, an end portion, close to the substrate 1, of the remaining buffer material layer 51 on the sidewall of the first mask layer 9 may be connected to the substrate 1 in a contact manner, so that the buffer material layer 51 may be supported by the substrate 1, and the buffer material layer 51 can be prevented from collapsing after the first mask layer 9 is subsequently removed, thereby increasing product yield. As shown in FIG. 11, in the process of removing the buffer material layer 51, a second mask layer 93 may be formed on the surface of the buffer material layer 51. The second mask layer 93 may be consumed during the etching of the buffer material layer 51. FIG. 12 is a schematic diagram after S530 is completed according to an embodiment of the disclosure.

At S540, the first mask layer 9 is removed.

The first mask layer 9 may be removed by means of a selective etching process. An etching gas or an etching solution may be set according to the specific material of the first mask layer 9. The etching gas or the etching solution of the first mask layer 9 is not specifically limited herein, as long as the first mask layer 9 can be removed and other film layer structures cannot be damaged.

At S550, annealing treatment is performed on the remaining buffer material layer 51, so as to form the buffer layer 5.

In an exemplary embodiment of the disclosure, the same annealing process may be performed on the buffer material layer 51 and the metal conductive layer 22, so as to cause the buffer material layer 51 to be converted into the buffer layer 5, and at the same, cause the metal conductive layer 22 to be converted into the conductive material layer 6. For example, after the capacitor contact hole 31 is formed, the metal conductive layer 22 may be formed in the capacitor contact hole 31. The metal conductive layer 22 may be fitly attached to the bottom and sidewall of the capacitor contact hole 31. That is to say, the metal conductive layer 22 may be fitly attached to the sidewall and bottom of the recessed portion 311, and may also be attached to the surface of the buffer layer 5. The capacitor contact hole 31 having the metal conductive layer 22 may be annealed. In this process, when the material of the metal conductive layer 22 is titanium or nickel, the silicon carbide in the buffer layer 5 may react with the titanium or nickel, so as to form titanium containing silicon carbide or nickel containing silicon carbide. In addition, the silicon in the substrate 1 may react with the titanium or nickel, so as to form silicon titanide or silicon nickel. The material in the sidewall of the capacitor contact hole 31 does not react with the titanium or nickel.

In the above process, the material of the buffer layer 5 is titanium containing silicon carbide or nickel containing silicon carbide. These materials have good conductivity and adhesion, so that the performance of the buffer layer can be guaranteed. In addition, since the buffer layer 5 is located between the conductive contact structure 3 and the word line structure 2, a physical dimension between the word line structure 2 and the conductive contact structure 3 is increased, so that an electric field between a drain and a gate can be reduced, so as to reduce a GIDL current. In addition, due to the increasing of the physical dimension, in addition to effectively reducing stand-by power consumption and improving the reliability of the device, maximum interface leak current between the substrate and source-drain doping areas (p-n) caused by excessively deep depth can be effectively avoided during etching.

It is to be noted that, although the various steps of the method for forming a semiconductor structure in the disclosure are described in a particular order in the drawings, this does not require or imply that the steps must be performed in the particular order, or that all shown steps must be performed to achieve desired results. Additionally or alternatively, certain steps may be omitted, a plurality of steps may be combined into one step for execution, and/or one step may be decomposed into a plurality steps for execution, and the like.

An embodiment of the disclosure further provides a memory. The memory may include the semiconductor structure in any of the above embodiments. The specific details, formation process and beneficial effects of the memory have been described in detail in the corresponding semiconductor structure and the method for forming a semiconductor structure, which are not be described herein again.

For example, the memory may be a Dynamic Random Access Memory (DRAM), a Static Random Access Memory (SRAM), or the like. Definitely, the memory may also be other storage apparatuses, which is not listed herein.

Other embodiment solutions of the disclosure will readily occur to those skilled in the art upon consideration of the specification and practice of the invention disclosed herein. The disclosure is intended to cover any variations, uses, or adaptations of the disclosure that follow the general principles of the disclosure and include common knowledge or techniques in the technical field that are not disclosed by the disclosure. The specification and examples are to be regarded as exemplary only, with the true scope and spirit of the disclosure being indicated by the appended claims.

What is claimed is:

1. A semiconductor structure, comprising:
a substrate, comprising an active area, wherein the active area comprises a channel area, and a source area and a drain area that are respectively distributed on two sides of the channel area, and the channel area has a word line groove, the drain area comprises a recessed portion that is recessed inward from the top;
a word line structure, located in the word line groove;
a conductive contact structure, connected to a top of the drain area;
a buffer layer which is formed on a surface of the drain area, located between the conductive contact structure and the word line structure, wherein the buffer layer is in contact with the conductive contact structure and insulated from the word line structure and the recessed portion is adjacent to the buffer layer and located on a same surface of the drain region, and
a conductive material layer, fitly attached to an inner wall of the recessed portion, wherein the conductive contact structure extends in a direction perpendicular to the substrate, and an end portion of the conductive contact structure close to the substrate extends into the recessed portion and fills the recessed portion having the conductive material layer.

2. The semiconductor structure of claim 1, wherein a material of the buffer layer is titanium containing silicon carbide or nickel containing silicon carbide.

3. The semiconductor structure of claim 1, wherein a material of the conductive material layer is silicon titanide or silicon nickel.

4. The semiconductor structure of claim 1, wherein a top of the word line structure is lower than a top surface of the word line groove, and the semiconductor structure further comprises:
a passivation layer, covering surfaces of the buffer layer and the substrate, wherein the passivation layer fills the word line groove.

5. The semiconductor structure of claim 4, further comprising:
an insulation layer, covering a surface of the passivation layer, wherein the conductive contact structure is capable of penetrating the insulation layer and the passivation layer, and filling the recessed portion having the conductive material layer.

6. The semiconductor structure of claim 5, further comprising:
a bit line contact structure, penetrating the insulation layer and the passivation layer and connected to the source area, wherein an orthographic projection of the bit line contact structure on the substrate does not overlap with an orthographic projection of the conductive contact structure on the substrate.

7. A memory, comprising a semiconductor structure, wherein the semiconductor structure comprises:
a substrate, comprising an active area, wherein the active area comprises a channel area, and a source area and a drain area that are respectively distributed on two sides of the channel area, and the channel area has a word line groove, the drain area comprises a recessed portion that is recessed inward from the top;
a word line structure, located in the word line groove;
a conductive contact structure, connected to a top of the drain area;
a buffer layer which is formed on a surface of the drain area, located between the conductive contact structure and the word line structure, wherein the buffer layer is in contact with the conductive contact structure and insulated from the word line structure and the recessed portion is adjacent to the buffer layer and located on a same surface of the drain region, and
a conductive material layer, fitly attached to an inner wall of the recessed portion, wherein the conductive contact structure extends in a direction perpendicular to the substrate, and an end portion of the conductive contact structure close to the substrate extends into the recessed portion and fills the recessed portion having the conductive material layer.

8. The memory of claim 7, wherein a material of the buffer layer is titanium containing silicon carbide or nickel containing silicon carbide.

9. The memory of claim 7, wherein a material of the conductive material layer is silicon titanide or silicon nickel.

* * * * *